(12) United States Patent
Hansen

(10) Patent No.: US 7,852,093 B2
(45) Date of Patent: Dec. 14, 2010

(54) ELIMINATING INLINE POSITIONAL ERRORS FOR FOUR-POINT RESISTANCE MEASUREMENT

(75) Inventor: Torben M. Hansen, Copenhagen Ø (DK)

(73) Assignee: Capres A/S, Lyngby (DK)

( * ) Notice: Subject to any disclaimer, the term of this patent is extended or adjusted under 35 U.S.C. 154(b) by 204 days.

(21) Appl. No.: 12/090,425

(22) PCT Filed: Oct. 17, 2006

(86) PCT No.: PCT/DK2006/000584

§ 371 (c)(1),
(2), (4) Date: Jul. 11, 2008

(87) PCT Pub. No.: WO2007/045246

PCT Pub. Date: Apr. 26, 2007

(65) Prior Publication Data

US 2008/0294365 A1    Nov. 27, 2008

(30) Foreign Application Priority Data

Oct. 17, 2005 (EP) .................................. 05388087

(51) Int. Cl.
*G01R 31/02* (2006.01)
(52) U.S. Cl. ...................................... 324/715; 324/713
(58) Field of Classification Search ................. 324/713, 324/715
See application file for complete search history.

(56) References Cited

U.S. PATENT DOCUMENTS

| | | | |
|---|---|---|---|
| 2,659,861 A | 11/1953 | Branson | |
| 3,456,186 A | 7/1969 | Bush et al. | |
| 3,676,775 A * | 7/1972 | Dupnock et al. | ............ 324/717 |
| 3,735,254 A | 5/1973 | Severin | |
| 4,546,318 A | 10/1985 | Bowden | |
| 4,703,252 A | 10/1987 | Perloff et al. | |
| 4,775,281 A | 10/1988 | Prentakis | |

(Continued)

FOREIGN PATENT DOCUMENTS

WO    WO 94/11745    5/1994

OTHER PUBLICATIONS

Yang et al.; "Determination of Three-Layer Earth Model from Wenner Four-Probe Test Data"; IEEE Transactions on Magnetics, IEEE Service Center, New York, NY, US, vol. 37, No. 5, Sep. 2001; XP011034079.

*Primary Examiner*—Vincent Q Nguyen
(74) *Attorney, Agent, or Firm*—Klein, O'Neill & Singh, LLP

(57) ABSTRACT

Calculating resistance correction factors includes contacting the arms of a four-arm probe with a test sample; selecting a first set of first and second arms and a second set of third and fourth arms; applying a first current from the first arm to the second arm of the first set; detecting a first voltage between the third and fourth arms of the second set; calculating a first resistance using the first voltage and current; selecting a third set of first and second arms including no more than one arm of the first set, and a fourth set of third and fourth arms including no more than one arm of the second set; applying a second current from the first arm to the second arm of the third set; detecting a second voltage between the third and fourth arms of the fourth set; calculating a second resistance using the second voltage and current; and calculating a correction factor using the first and second resistances.

7 Claims, 6 Drawing Sheets

U.S. PATENT DOCUMENTS

| | | |
|---|---|---|
| 4,929,893 A | 5/1990 | Sato et al. |
| 4,989,154 A | 1/1991 | Yamashita et al. |
| 5,691,648 A | 11/1997 | Cheng |
| 6,747,445 B2 | 6/2004 | Fetterman et al. |
| 6,943,571 B2 | 9/2005 | Worledge |
| 2005/0062448 A1 | 3/2005 | Oh et al. |
| 2005/0081609 A1 | 4/2005 | Worledge |
| 2005/0151552 A1 | 7/2005 | Abraham et al. |

* cited by examiner

ELIMINATING INLINE POSITIONAL ERRORS FOR FOUR-POINT RESISTANCE MEASUREMENT

CROSS-REFERENCE TO RELATED APPLICATION

This application is a national phase filing, under 35 U.S.C. §371(c), of International Application No. PCT/DK2006/000570, filed Oct. 17, 2006, the disclosure of which is incorporated herein by reference in its entirety.

FEDERALLY SPONSORED RESEARCH OR DEVELOPMENT

Not Applicable

TECHNICAL FIELD

The present invention relates to a system and method for calculation correction factors for reducing or eliminating positional errors in resistance measurements and to a method and system for performing resistance measurements for determining the sheet resistance of test samples. Furthermore, the present invention relates to a method for obtaining a characteristic electrical property of a test sample.

BACKGROUND OF THE INVENTION

Related systems and methods may be found in publications such as US 2004/0183554, U.S. Pat. Nos. 6,943,571, 4,703, 252, 5,691,648, 6,747,445, US 2005/0151552, US 2005/0081609, U.S. Pat. Nos. 3,735,254, 3,456,186, WO 94/11745 and US 2005/0062448. Reference is made to all of the above-mentioned US patent publications, all of which are hereby incorporated in the present specification by reference in their entirety for all purposes.

When performing resistance measurements for determining the resistance of a test sample, the surface of the test sample and the way that a probe used for performing the measurements are brought into contact with the surface of the test sample errors are induced by the fact that probe arms of the test probe are positioned so that the distances between individual probes vary from the assumed distances and the current distribution in the surface of the test sample therefore is not as assumed. The present invention provides a method and system for eliminating in-line positional errors, especially in four-point probe resistance measurements.

Methods such as disclosed in US 2004/0183554 have several disadvantages, e.g. it requires knowledge of the nominal spacing. Also, there are no elimination deviations in the nominal spacing. Further the known methods are approximate. Therefore, there is a need for a method, which is exact.

SUMMARY OF THE INVENTION

According to the first aspect of the present invention, a method for calculating a correction factor for reduction of positional errors in resistance measurements using four-point probes is provided. The four-point probe has a body and four probe arms, each including a probe, the probe arms extending parallel from the body, the four-point probe including electrical contact points for establishing electrical contact between the probes and a test apparatus transmitting and receiving electrical signals. The method may comprise the steps of:

positioning the probe arms in contact with a surface of the test sample, selecting a first set comprising a first and a second probe arm and a second set comprising a third and a fourth probe arm, applying a first current from the test apparatus through the first probe arm of the first set to the second probe arm of the first set, the first current propagating through the test sample, detecting a first induced voltage between the third and fourth probe arms of the second set, calculating a first four-point resistance, $R_{first}$, being a ratio of the first voltage and the first current, selecting a third set comprising a first and a second probe arm, wherein the third set includes no more than one of the probe arms of the first set, and a fourth set comprising a third and a fourth probe arm wherein the fourth set includes no more than one of the probe arms of the second set, applying a second current from the test apparatus through the first probe arm of the third set to the second probe arm of the third set, the second current propagating through the test sample, detecting a second induced voltage at the third and fourth probe arms of the fourth set, calculating a second four-point resistance, $R_{second}$, being a ratio of the second voltage and the second current, calculating a correction factor, based on the first and second four-point resistances.

Although the present invention is directed at four-point probes, the probes may include more than four probe arms each including at least one probe and measurements may e.g. be performed using four of these probes. Also, the probe arms need not extend parallel from the probe body, but the probes, at the end of the probe arms, are preferably arranged on a line, meaning that the probe arms may have other geometrical configurations than linear or rectangular.

The probe and the test sample are preferably arranged in a test apparatus having two or more holders for holding the test sample and probe, respectively. The test probe and the test sample is brought into contact with each other, either by moving the test probe or the test sample or both so that these are brought into contact. The verification of contact between the test probe and the test sample may be verified, e.g. optically/visually or using electrical methods for verifying the contact.

Ideally the surface of the test sample is flat and the probe arms of the test probe are brought into contact with the surface of the test sample so that the probes are positioned in-line having a pre-defined or known spacing. However, as this is not the case in the real world, the present invention provides a method for calculating an improved correction factor for reducing or eliminating the errors caused by the non-ideal positioning of the probes on the surface of the test sample.

In the four-point probe, a first set comprising two probe arms of the four-probe arms of the test probe is selected and a second group comprising two probe arms different from the probe arms of the first set is selected. A current is applied to one of the probe arms of the first set whereby the current is propagated through the surface of the test sample. A voltage is thereby induced in the test sample. This induced voltage may then be measured or determined using the first and second probe arms of the second set of probe arms.

From the applied current and the measured voltage a four-point resistance may be calculated as the ratio between the voltage and the current. The sheet resistance may also be measured.

A third set comprising a first and a second probe arm is selected and, provided the probe includes only four probe arms, the third set may include only one of the probe arms of the first set or alternatively the second set. A fourth set of probe arms is selected, wherein the probe arms of the fourth set include no more than one of the probe arms of the second set, or alternatively the first set.

A second current is then applied on the probe arms of the third set, or in the alternative on the probe arms of the fourth set. As the current propagates through the surface of the test sample a voltage is induced which may be determined or measured at the probe arms of the fourth set, alternatively third set. As before, a four-point sheet resistance may be calculated based on the ratio of the second voltage and the current.

In one embodiment, the calculation of the correction factor by the relation between two four-point resistances given by $R_{first}/R_{second}=1-(\ln(1-\gamma)/\ln(\gamma))$. A correction factor is then given by $C_{second}=2\Pi/\ln(\gamma)$ and the sheet resistance by $R_{sq}=C_{second}R_{second}$ The factor $\gamma$ may require the use of numerical methods. $\gamma$ is a factor dependant on the geometrical configuration of the probes of a four-point probe as described elsewhere in the present specification.

According to the teachings of the present invention, the method according to the first aspect may further include performing a measurement for calculating resistance of said test sample using the correction factor.

After calculating the correction factor for a given configuration of the probe arms the probe arms are preferably not moved while performing the above-mentioned measurements and calculations. The sheet resistance may then be calculated using the correction factor as calculated above. Although the second four-point resistance is used as described above, the first four-point resistance may alternatively be used for calculating the sheet resistance of the test sample.

Advantageously, the probes may be repeatedly moved to a remote position and the steps of claim 1 and 2 are repeatedly performed for each position.

It may be necessary to determine the sheet resistance of the test sample at multiple positions and the test probe may then be stepwise moved to these locations where the calculation of the correction factor may be performed and the subsequent measurement or determination of the sheet resistance is formed.

A second aspect of the present invention relates to a method for performing resistance measurements using four-point probes using an improved correction factor for reduction or elimination of positional errors, said four-point probe having a body and four probe arms each including a probe, said probe arms extending parallel from said body, said four-point probe including electrical contact points for establishing electrical contact between said probes and a test apparatus transmitting and receiving electrical signals, said method comprising the steps of:

positioning said probe arms in contact with a surface of said test sample, selecting a first set comprising a first and a second probe arm and a second set comprising a third and a fourth probe arm, applying a first current from said test apparatus through said first probe arm of said first set to said second probe arm of said first set, said first current propagating through said test sample, detecting a first induced voltage at said third and fourth probe arms of said second set, calculating a first four-point resistance, $R_{first}$, based on a ratio of said first voltage and said first current, selecting a third set comprising a first and a second probe arm, wherein said third set includes no more than one of said probe arms of said first set, and a fourth set comprising a third and a fourth probe arm wherein said fourth set includes no more than one of said probe arms of said second set, applying a second current from said test apparatus through said first probe arm of said third set to said second probe arm of said third set, said second current propagating through said test sample, detecting a second induced voltage between said third and fourth probe arms of said fourth set, calculating a second four-point resistance, $R_{second}$, being a ratio of said second voltage and said second current, calculating a correction factor based on said first and second four-point resistances, and calculating a resistance of said test sample using said correction factor.

The method according to the second aspect may include any of the features mentioned in relation to the first aspect of the present invention.

A third aspect of the present invention relates to a test apparatus having a first and a second holder for holding a test sample and a test probe, respectively, a memory device for storing a computer implementation of the method according to the first and/or second aspect and a microprocessor for executing the computer implementation of the method according to the first and/or second aspect.

The test apparatus according to the third aspect of the present invention may include any of the features of the method mentioned in relation to the first and/or second aspect of the present invention.

In a fourth aspect the present invention relates to a method for obtaining a characteristic electrical property of a test sample by using a probe having a body and a plurality of probe arms each including a probe tip, the characteristic electrical property including a resistance property, the plurality being at least four, the probe arms extending parallel from the body, the probe including electrical contact points for establishing electrical contact between the probe tips and a test apparatus transmitting and receiving electrical signals to and from the probe tips, the method may comprise the following steps:

(a) positioning the probe tips in contact with a surface of the test sample, (b) selecting a subset of four probe tips for performing a measurement by applying a current between a first set of two probe tips and determining a voltage between a second set of two probe tips not including any of the probe tips of the first set, and performing the measurement for all combinations of sets of probe tips, (c) establishing a model value of the characteristic electrical property, (d) calculating model data for the characteristic electrical property based on the model value, provided the measurement and the calculated model data does not converge, establishing an adjusted model value and repeating step (d) using the adjusted model value, provided the measurement and the calculated model data do converge, extracting the characteristic electrical property from the model data.

The test apparatus may comprise actuators or other devices for moving the test probe into a position where the tips are in electrical contact with the surface of the test sample. The test probe may be of a kind similar to that disclosed in publications such as US 2004/0056674 and EP 1 610 131, and the test apparatus may be of a kind similar to that disclosed in publications such as US 2005/0127929 and EP 1 466 182. Reference is made to the above mentioned US patent publications, all of which is hereby incorporated into the present specification by reference.

As the probe comprises at least four probe tips, it is possible to choose combinations of two sets of two probe tips in several ways. The sets chosen in each combination do not contain any common tips. E.g. if a probe comprises the tips A, B, C and D, a first combination may be a set of A and B, and the second set being C and D. A second combination may then be a first set of A and C, and a second set of B and D. A third combination may then be a first set of B and C, and a second set of A and D. Using a probe having more tips results in further combination possibilities.

The measurements are then performed using the combinations of these sets. Model data is then calculated, based on a model value for the electrical property, for each of the combinations used. The model value may start out as an initial guess, and may be based on knowledge of the test sample.

The model data is then compared to the measured data. Provided the model data and the measured data are sufficiently close, then the method will have given an acceptable value of the characteristic electrical property of the test sample. It may be necessary to adjust the model value and repeat the calculation and comparison to the measured value or values. The adjustment may be either up or down or both if more than one characteristic electrical property is to be determined at once. The adjustment may be repeated until an acceptable result is achieved.

There may be predefined a threshold value for the difference in model data and measured data. Alternatively, the iterative process may determine a point where the difference is at a minimum.

In a further embodiment, the method may comprise calculating a corrected value of one of the measurements. One or more of the measurements may be corrected by a correction factor, or by a correction function.

In a presently preferred embodiment, the characteristic electrical property is top-layer resistance, bottom-layer resistance, resistance-area product, or any combination thereof. Other electrical properties may be determined as well.

In an advantageous embodiment of the present invention, the model data is calculated using the formula $$f^i_{CIPT}(R_T, R_B, RA) = \frac{R_T R_B}{2\pi(R_T + R_B)} \left\{ \begin{array}{c} \frac{R_T}{R_B}\left(K_0\left(\frac{w^i}{\lambda}\right) + K_0\left(\frac{z^i}{\lambda}\right) - \right) \\ K_0\left(\frac{y^i}{\lambda}\right) + \ln\left(\frac{x^i y^i}{z^i w^i}\right) \end{array} \right\}.$$

The values x, y, z and w are distances between probe arms in a given configuration, as will be evident from the below description of the attached figures. $R_T$ is the top-layer resistance, $R_B$ is the bottom-layer resistance and RA is the resistance area product. $K_0$ is the modified Bessel function of the second kind, 0'th order. λ is the transition length given by:

$$\lambda = \sqrt{\frac{RA}{R_T + R_B}}$$

In an advantageous embodiment of the present invention, the method may further include performing a correction on one of said calculated model data. The correction may be performed on one or more of the calculated model data.

The method according to the fourth aspect of the present invention may include any of the features of any of the aspects one, two and/or three.

BRIEF DESCRIPTION OF THE DRAWINGS

The present invention is now to be described with reference to the attached schematic illustrations, in which.

DETAILED DESCRIPTION OF THE INVENTION

Figure 1:
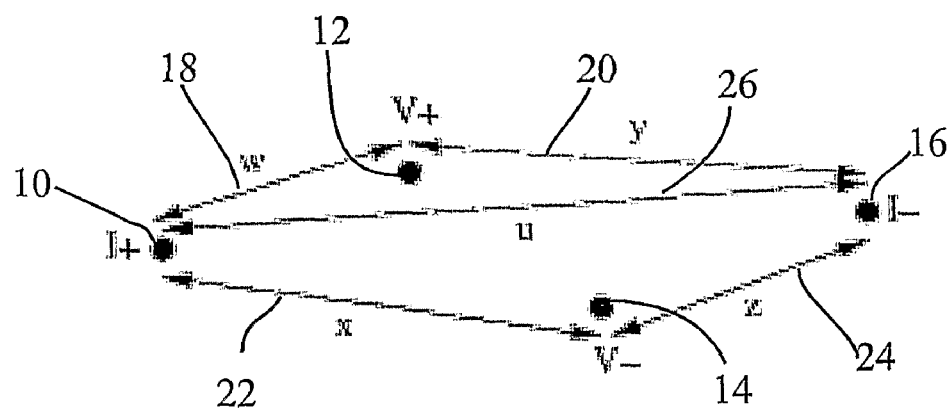
FIG. 1 is a schematic illustration of positions of four probes and distances between them.

FIG. 1. schematically illustrates a four-point probe in contact with the surface. When a multi-point probe, such as a four-point probe, is freely suspended, the arms constituting the point probes are freely extending from the body of the multi-point probe and as such, in theory at least, are positioned in-line with the known distance between the end points of the probe and are brought into contact with the surface of the sample. The arms are displaced relative to each other partly due to surface errors or surface irregularities and possibly also due to the probes' position relative to the surface of the sample. The spacing between the probes may vary due to uncertainty in production or vibrations. The difference in the relative spacing of the probes is illustrated in FIG. 1 in that four probe arms (10, 12, 14, 16) are displaced relative to each other and where in between distances are illustrated by the arrows (18, 20, 22, 24, 26).

Assuming that the four-point probes (10, 12, 14, 16) are positioned in-line and with known spacing on the surface of the test sample will result in an imprecise or erroneous measurement as the current distribution and current and all voltage measured are different from the theoretical assumptions.

Figure 2:
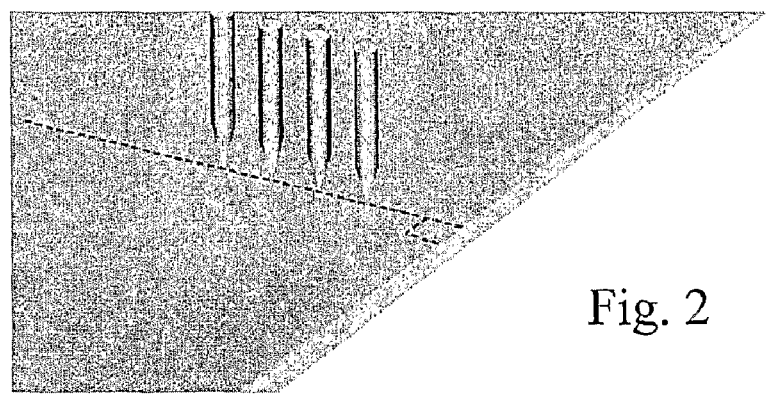
FIG. 2 is a schematic illustration of four probes positioned on the surface of a test sample.

For an infinite sheet the four-point voltage to current ratio may be expressed as $$R_{App} = \frac{V}{I} = \frac{R_s}{2\pi}\ln\left(\frac{xy}{wz}\right),$$

where w, x, y and z are distances as given in FIG. 2 and $R_s$ is the sheet resistance of the sheet. A total of 24 perturbations of interchanging electrodes exist; however these 24 perturbations can be divided into 3 groups each consisting of 8 equivalent configurations. Within each group the measured four-point resistance will differ at most by a change of sign. The four-point resistance for each group is designated $R_A$, $R_B$ and $R_C$. These ratios are so defined that they always are positive.

The following relation exists between the four-point resistances.

$$R_A = R_B + R_C$$

Figure 2A:
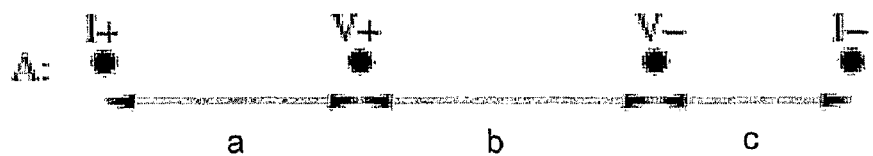
FIGS. 2a-2c are schematic illustrations of three configurations of four-point probes and distances between the probes.
Figure 2B:
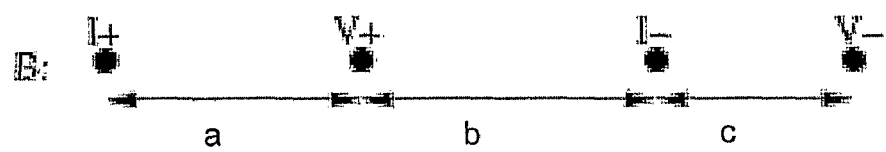
Figure 2C:
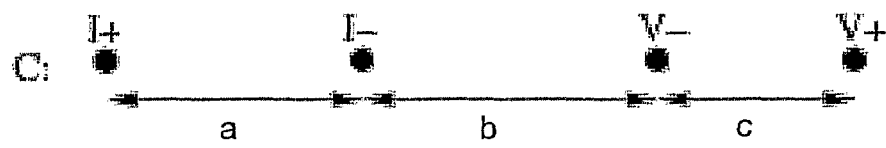

For linear configurations, representative configurations for each of these groups are illustrated in FIGS. 2a to 2c. The voltage-to-current ratio for these configuration are given as $$R_A = \frac{V_A}{I_A} = \frac{R_s}{2\pi} \ln\alpha$$

$$R_B = \frac{V_B}{I_B} = \frac{R_s}{2\pi} \ln\beta$$

$$R_C = \frac{V_C}{I_C} = \frac{R_s}{2\pi} \ln\gamma,$$

where the parameters $\alpha$, $\beta$ and $\gamma$ are given by $$\alpha = \frac{(a+b)(b+c)}{ac}$$

$$\beta = \frac{b(a+b+c)}{ac}$$

$$\gamma = \frac{(a+b)(b+c)}{b(a+b+c)}.$$

With manipulation it can be found that the following relations exist between the parameters $$\alpha = \beta + 1 = \frac{\gamma}{\gamma - 1} = \beta\gamma$$

$$\beta = \alpha - 1 = \frac{1}{\gamma - 1} = \frac{\gamma}{\alpha}$$

$$\gamma = \frac{\alpha}{\alpha - 1} = \frac{\beta + 1}{\beta} = \frac{\alpha}{\beta}$$

Performing two measurements using the configuration illustrated in FIG. 2A and the configuration illustrated in FIG. 2C we can make the following relation $$\frac{R_A}{R_C} = \frac{R_s/2\pi \ln\alpha}{R_s/2\pi \ln\gamma},$$

and using the above relations, we can reduce this to $$\frac{R_A}{R_C} = 1 - \frac{\ln(\gamma - 1)}{\ln\gamma}.$$

Thus we can uniquely determine $\gamma$ from the ratio $R_A$ to $R_C$. Due to the complexity of the relation $\gamma$ must be found using numerical methods. This task may be performed using suitable routines from programmes for numerical solution of equations, e.g. MINPACK. When $\gamma$ has been determined we may calculate the sheet resistance from $$R_S^{AC} = \frac{2\pi}{\ln\gamma} R_C$$

where the index AC indicates that the sheet resistance is based on the A and C configurations. In principle any other ratio of two of $R_A$, $R_B$ and $R_C$ can be used to find any of the three parameters $\alpha$, $\beta$ or $\gamma$, and the sheet resistance can be found using the appropriate relation.

Since the spacings a, b and c are eliminated the method will find the correct sheet resistance independent of the real spacings. Thus any variations in positioning of the electrodes are also eliminated.

At least the following relations between four-point resistances and possible search parameters exist:

$$R_A/R_B = \ln(\alpha)/\ln(\alpha - 1) \quad \text{a1}$$

$$R_A/R_B = \ln(\beta + 1)/\ln(\beta) \quad \text{b1}$$

$$R_A/R_B = -\ln(\gamma - 1)/\ln(\gamma) \quad \text{c1}$$

$$R_A/R_C = \ln(\alpha)/(\ln(\alpha) - \ln(\alpha - 1)) \quad \text{d1}$$

$$R_A/R_C = \ln(\beta + 1)/\ln(1 + 1/\beta) \quad \text{e1}$$

$$R_A/R_C = 1 - \ln(1 - \gamma)/\ln(\gamma) \quad \text{f1}$$

$$R_B/R_C = \ln(\alpha - 1)/(\ln(\alpha) - \ln(\alpha - 1)) \quad \text{g1}$$

$$R_B/R_C = \ln(\beta)/(\ln(\beta + 1) - \ln(\beta)) \quad \text{h1}$$

$$R_B/R_C = -\ln(\gamma - 1)/\ln(\gamma) \quad \text{i1}$$

Further each relation may in the implementation be represented by its reciprocal expression. In some configurations of the four-point measurement a change of sign will be needed.

The sheet resistance may be given by any of the following relations:

$$R_{sq} = R_A 2\Pi/\ln(\alpha) \quad \text{a2}$$

$$R_{sq} = R_A 2\Pi/\ln(\beta + 1) \quad \text{b2}$$

$$R_{sq} = R_A 2\Pi/\ln(\gamma/(\gamma - 1)) \quad \text{c2}$$

$$R_{sq} = R_B 2\Pi/\ln(\alpha - 1) \quad \text{d2}$$

$$R_{sq} = R_B 2\Pi/\ln(\beta) \quad \text{e2}$$

$$R_{sq} = -R_B 2\Pi/\ln(\gamma - 1) \quad \text{f2}$$

$$R_{sq} = R_C 2\Pi/\ln(\alpha/(\alpha - 1)) \quad \text{g2}$$

$$R_{sq} = R_C 2\Pi/\ln((\beta + 1)/\beta) \quad \text{h2}$$

$$R_{sq} = R_C 2\Pi/\ln(\gamma) \quad \text{i2}$$

Any two of these relations, one from the first group and one from the second group, both containing the same parameter $\alpha$, $\beta$ or $\gamma$ will constitute a functional implementation of the method, e.g. a1 and g2, or e1 and b2. These relations may be derived from the previously equations. Further each of these relations may be modified by imposing $R_A = R_B + R_C$.

Isolation of a search parameter in the second group and insertion in the first group will also constitute a valid implementation.

Figure 3:
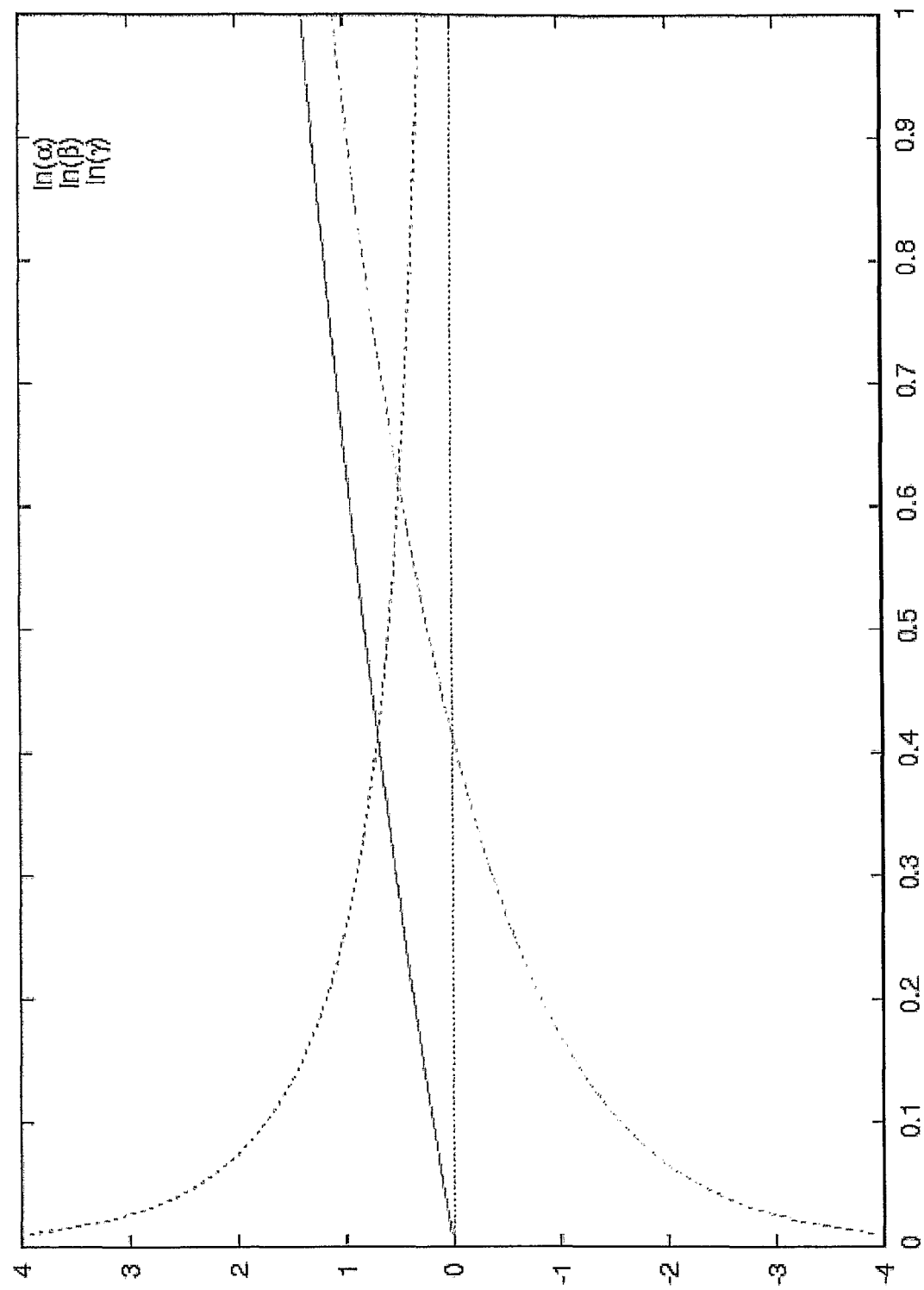
FIG. 3 is a schematic illustration of a logarithmic functions of α, β and γ as a function of b/a, with c=a, FIG. 4 is a schematic illustration of a numerical simulation of error due to barrier parallel to the in-line direction.

FIG. 3 is a schematic illustration of logarithmic functions of $\alpha$, $\beta$ and $\gamma$ as a function of b/a, with c=a.

The method according to the present invention of eliminating errors due to error positioning in the in-line direction, does not increase the sensitivity to other errors such as electromagnetic radiation and positioning errors perpendicular to the in-line direction.

Errors due to electromagnetic radiation and cross-over from current source to voltage sensors e.g. due to variation in contact resistance, we can assume to result in stochastic variations directly on the measured voltage-to-current ratio. Thus we can describe the sensitivity for the normal four-point probe method simply as $$\frac{\partial R_s}{\partial R_A} = \frac{2\pi}{\ln\alpha},$$

and equivalently for the B and C configurations. For the presented method we have the following expression $$\frac{\partial R_s^{AC}}{\partial R_A} = -\frac{2\pi}{\alpha \ln^2 \alpha} R_A \frac{\partial \alpha}{\partial R_A} + \frac{2\pi}{\ln\alpha}.$$

We will use $R_A/R_C$ to find $\alpha$ from $$\frac{R_A}{R_C} = \frac{\ln\alpha}{\ln\left(\frac{\alpha}{\alpha-1}\right)}.$$

By differentiating both sides with respect to $R_A$ and performing manipulation we find $$\frac{\partial \alpha}{\partial R_A} = \frac{(\alpha^2 - \alpha)\ln^2 \frac{\alpha}{\alpha-1}}{R_C\left(\ln\alpha + (\alpha-1)\ln\frac{\alpha}{\alpha-1}\right)}.$$

By inserting equation 2 into 1 and assuming that we know $\alpha$ from the nominal electrode spacings, we find that the ratio $$f_{ACA} = \frac{\partial R_s^{AC}/\partial R_A}{\partial R_s/\partial R_A}$$

is always between 0 and 1 meaning that the presented method always gives better or the same sensitivity compared to the simple method of using directly the nominal spacing. For a symmetric probe spacings with a=b=c we find that the ratio $f_{ACA}$ is 0.616, an improvement of approximately 40%. Unfortunately the ratio for the AC configuration sensitivity towards variations in $R_C$ $f_{ACC}$ is 1.894 indicating that the corrected method is almost two times as sensitive to variations in $R_C$ as the uncorrected is towards variations in $R_A$. Overall the sensitivity towards variations in the voltage-to-current ratios is increased approximately by a factor of 2. This may appear to be a problem, however, since in real life measurements the measurements error is dominated by positioning errors, at least for microscopic four-point probes, the method is still an improvement over the non-corrected method.

Further it is our experience that the relative rather than the absolute noise is the same for $R_A$ and $R_C$. Using that information we can write the noise in the corrected sheet resistance $$\sigma_{R_s}^{rel,c} = \frac{1}{R_s}\sqrt{(f_{ACC}R_C)^2(\sigma_R^{rel})^2 + (f_{ACA}R_A)^2(\sigma_R^{rel})^2}$$

$$= \sigma_R^{rel}\sqrt{\left(f_{ACC}\frac{\ln\frac{\alpha}{\alpha-1}}{2\pi}\right)^2 + \left(f_{ACA}\frac{\ln\alpha}{2\pi}\right)^2}$$

where $\sigma_{R_s}^{rel,c}$ and $\sigma_R^{rel}$ is the relative standard deviation in the corrected sheet resistance and the relative standard deviation in the measured voltage-to-current ratios. Again for a symmetric probe this factor $\sigma_{R_s}^{rel,c}/\sigma_R^{rel}$ becomes 0.629. Thus we have an overall noise suppression of 37%.

The voltage-to-current ratios for standard linear four-point probe are to first order insensitive to positioning error in the direction perpendicular to the in-line direction. Thus since the correction method uses directly these ratios it too becomes insensitive to such positioning errors to first order.

Surprisingly, it turns out that the method according to the present invention eliminates the influence of non-conducting barriers parallel to the line on which the electrodes are positioned.

Figure 4:
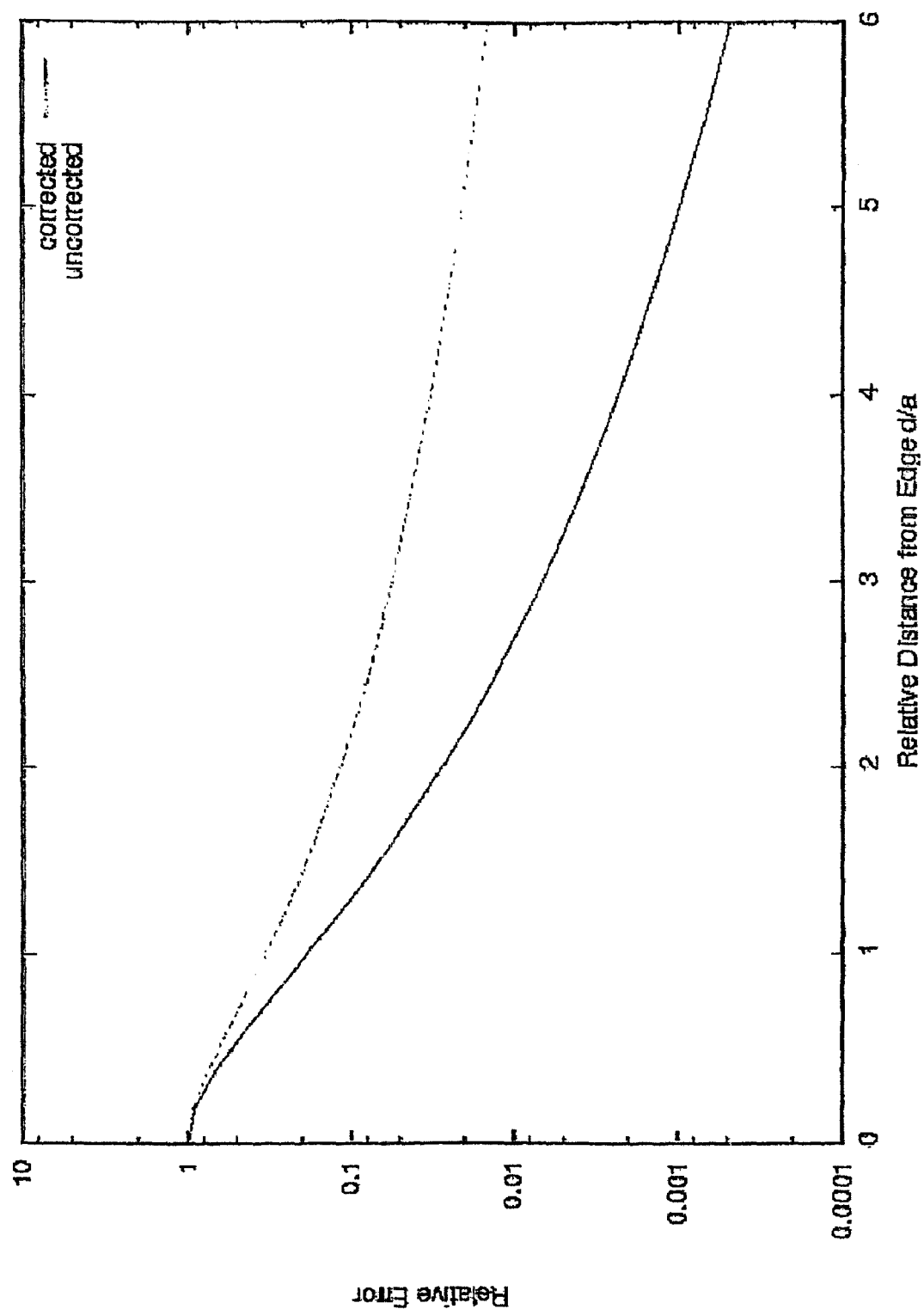

The above findings suggest that it might be possible to eliminate sample shape entirely. However, analytical studies with a barrier along the in-line direction show that this cannot be eliminated. On the other hand numerical studies show that the error is significantly decreased. FIG. 4 shows the simulated measurement error as a function of distance to the barrier. The distance is normalized with respect to the electrode spacings. The probe is assumed to be symmetric with a=b=c. The dashed curve shows the measurement error for a non-corrected sheet resistance while the solid curve shows the error for the corrected sheet resistance. As can be seen from the figure the method greatly improves the measurement error. For the corrected sheet resistance the error is less than 1% at a distance of just 3 times the electrode spacing. This situation occurs for the uncorrected sheet resistance at a distance of 7 times the electrode spacing.

Figure 5:
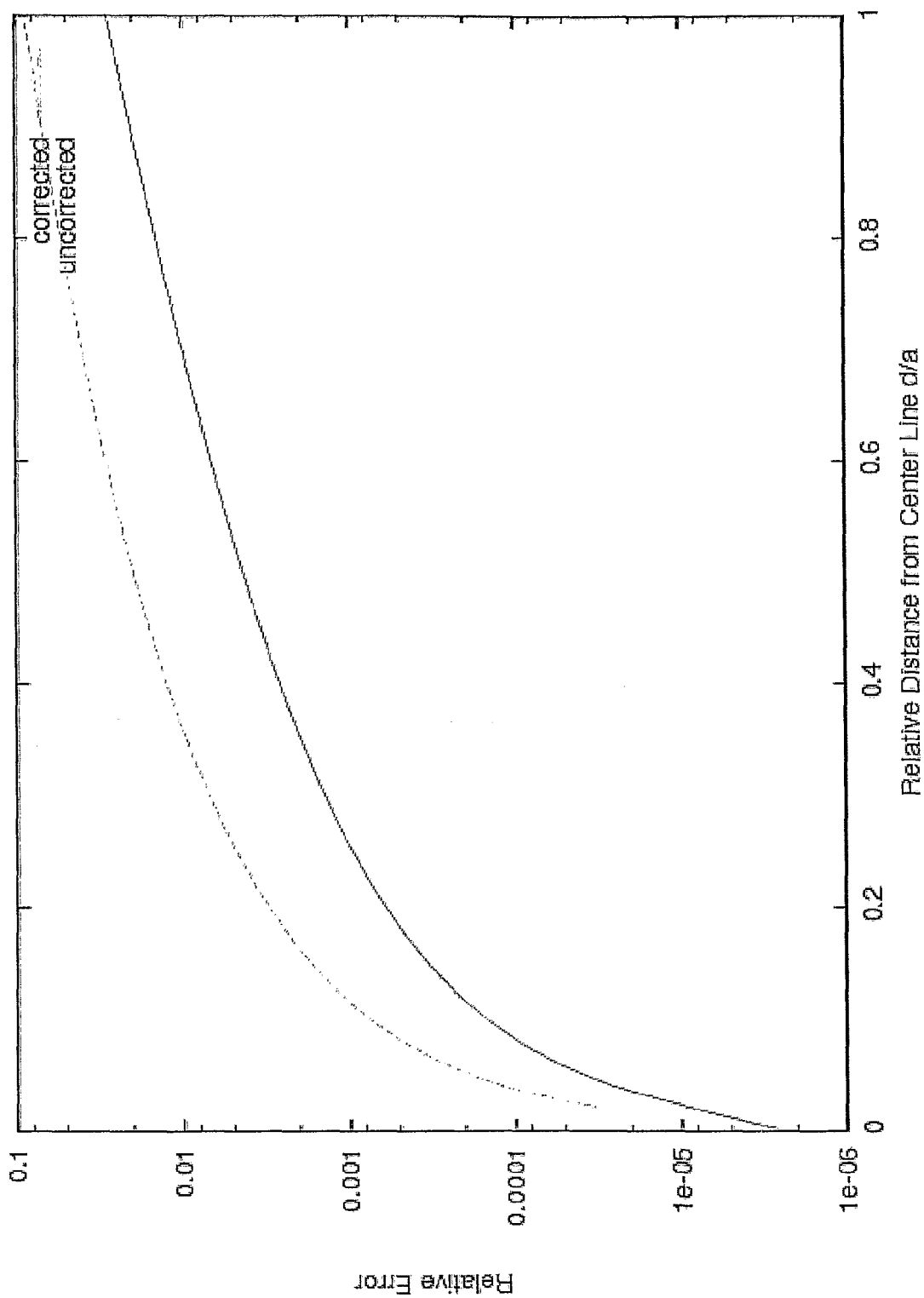
FIG. 5 is a schematic illustration of numerical simulation of measurement errors on a rectangular sample.

This effect too can be eliminated if the probe is placed in the centre between two parallel barriers, or on a rectangular sample. FIG. 5 shows the error when measuring a rectangular sample.

Again we have assumed a symmetric probe. For the uncorrected sheet resistance we have used a correction factor assuming a known sample dimension and a probe located at the centre of the sample. The sample dimensions are 5 by 5 times the electrode spacing. As seen from the figure the method greatly improves the error due to misalignment of probe position. Further, unlike for the uncorrected case, it is not needed to know the exact sample dimensions if just the probe is positioned approximately in the middle of the sample.

If the sample has well-known dimensions and is very narrow, the measured value depends only weakly on the position, and the method does not provide any improvement. However, in such case the width of the sample must be known. If width is not known, the correction method is still usable to find approximate correction factors. For large samples the measurement is improved even more.

FIG. 5 is a schematic illustration of numerical simulation of measurement errors on a rectangular sample. The dashed line shows the uncorrected sheet resistance and the solid line illustrates the corrected sheet resistance.

The sample used for the simulation is a rectangular sample having a side length in the direction parallel to the in-line direction of the 5 times the electrode spacing and a side length perpendicular to the in-line direction of 5 times electrode spacing. The probe is symmetric with a=b=c. For the uncorrected sheet resistance the sample dimensions is assumed to be known and the error is calculated relative to a situation where the probe is located on the centre line.

In the following below, $R_B$ denotes the bottom resistance and not as above resistance for the B-configuration for the four point measurements.

In the general case we want to find a number of parameters that characterize the sample under investigation. If we have a model that describes the expected measurement value as a function of these parameters we can search for the parameters that give the best fit to the measured data. Mathematically this is described as $$\min_P \|f_{Model}(P) - f_{Measured}\|,$$

where P is a set of parameter we search for, $f_{Model}$ is the function to calculate the expected measurement values from the given model and $f_{Measured}$ is a vector containing the measured values. The bars represent a norm; usually the $l_1$ or $l_2$ norm is chosen.

In order to decrease the influence of measurement artifacts in the parameters obtained we can introduce a correction scheme. We represent the correction scheme by the function G which takes as arguments either the measured values or the values calculated from the model. We can then write the problem of finding the model parameters as:

$$\min_P \|G\{f_{Model}(P)\} - G\{f_{Measured}\}\|.$$

The optimal choice of G depends on the actual sample geometry and the model chosen to represent the sample. The optimal G is the one that minimizes the sensitivity for the above minimum with respect to possible measurement errors.

In the case of four-point measurement on current in plane tunnelling, CIPT, samples we have the following model $$f_{CIPT}^i(R_T, R_B, RA) = \frac{R_T R_B}{2\pi(R_T + R_B)} \left\{ \frac{R_T}{R_B} \left( K_0\left(\frac{w^i}{\lambda}\right) + K_0\left(\frac{z^i}{\lambda}\right) - K_0\left(\frac{y^i}{\lambda}\right) \right) + \ln\left(\frac{x^i y^i}{z^i w^i}\right) \right\}$$

with the transition length $$\lambda = \sqrt{\frac{RA}{R_T + R_B}},$$

and $x^i$, $y^i$, $z^i$ and $w^i$ are the distances given in FIG. 1, for the i-th configuration. The set of parameters comprises top-layer resistance $R_T$, bottom-layer resistance $R_B$, and the resistance-area product RA. $K_0$ is the modified Bessel function of second kind, zero-th order.

We choose several groups, or sets, of contact points, each group comprising four points located approximately along a line. For each group we obtain a first four-point resistance. For a sub-set of the groups (possibly all) we obtain a second four-point resistance and calculate a corrected resistance using the method described earlier, and so on.

Using the model above we calculate the expected first and second four-pointed resistances for a first guess of $R_T$, $R_B$, and RA.

We then adjust the parameters $R_T$, $R_B$, and RA until we have minimized the difference from the measured and corrected data to the calculated data.

Other correction schemes may be used, which might be better for the specific sample geometry or which demands lower computational effort. The important issue is that the correction scheme is performed on both the measured data and the data calculated from the model in order to obtain comparable values.

If we imagine using a probe with 6 tips numbered 1 to 6, we can exemplify the usual measurement scheme as follows Step 1: Measure the four-point resistance using $$f_{Measured}^1 = R_{4pp}(n_{i1}=1, n_{v1}=2, n_{v2}=3, n_{i2}=4)$$

$$f_{Measured}^2 = R_{4pp}(n_{i1}=2, n_{v1}=3, n_{v2}=4, n_{i2}=5)$$

$$f_{Measured}^3 = R_{4pp}(n_{i1}=3, n_{v1}=4, n_{v2}=5, n_{i2}=6)$$

$$f_{Measured}^4 = R_{4pp}(n_{i1}=1, n_{v1}=3, n_{v2}=4, n_{i2}=5)$$

$$f_{Measured}^5 = R_{4pp}(n_{i1}=1, n_{v1}=3, n_{v2}=5, n_{i2}=6)$$

where $n_{i1}$ is the tip number where current is applied, $n_{i2}$ is the tip number where current drawn out, $n_{v1}$ and $n_{v1}$ are the tips over which the voltage is measured.

Step 2: Guess initial parameters $R_T = R_{T,0}$, $R_B = R_{B,0}$, $RA = RA_0$.

Step 3: Calculate model data using the equations:

$$f_{Model}^1 = f_{CIPT}(x^1 = d_{13}, y^1 = d_{24}, z^1 = d_{12}, w^1 = d_{34})$$

$$f_{Model}^2 = f_{CIPT}(x^2 = d_{24}, y^2 = d_{35}, z^2 = d_{23}, w^2 = d_{45})$$

$$f_{Model}^3 = f_{CIPT}(x^3 = d_{35}, y^3 = d_{45}, z^3 = d_{34}, w^3 = d_{56})$$

$$f_{Model}^4 = f_{CIPT}(x^4 = d_{14}, y^4 = d_{35}, z^4 = d_{13}, w^4 = d_{45})$$

$$f_{Model}^5 = f_{CIPT}(x^5 = d_{15}, y^5 = d_{36}, z^5 = d_{13}, w^5 = d_{56})$$

where $d_{kl}$ is the distance between the k-th and the l-th tip.

Step 4: Calculate the objective function $$F_{Obj} = \sum_{i=1}^{5} (f_{Model}^i - f_{Measured}^i)^2$$

where we have used the $l_2$-norm in the equation $$\min_P \|G\{f_{Model}(P)\} - G\{f_{Measured}\}\|.$$

Step 5: Adjust parameters and redo steps 3 and 4 until $F_{Obj}$ have reached minimum.

Step 6: Extract resulting parameters $R_T$, $R_B$ and RA.

The following is an example where correction is performed on two sets of measurements. In the case of using correction on the first two sets, or groups, of tips the scheme becomes Step 1: Measure the four-point resistance using $$f_{Measured}^{1A} = R_{4pp}(n_{i1}=1, n_{v1}=2, n_{v2}=3, n_{i2}=4)$$

$$f_{Measured}^{1C} = R_{4pp}(n_{i1}=1, n_{v1}=4, n_{v2}=3, n_{i2}=2)$$

$$f_{Measured}^{2A} = R_{4pp}(n_{i1}=2, n_{v1}=3, n_{v2}=4, n_{i2}=5)$$

$$f_{Measured}^{2C} = R_{4pp}(n_{i1}=2, n_{v1}=5, n_{v2}=4, n_{i2}=3)$$

$$f_{Measured}^{3} = R_{4pp}(n_{i1}=3, n_{v1}=4, n_{v2}=5, n_{i2}=6)$$

$$f_{Measured}^{4} = R_{4pp}(n_{i1}=1, n_{v1}=3, n_{v2}=4, n_{i2}=5)$$

$$f_{Measured}^{5} = R_{4pp}(n_{i1}=1, n_{v1}=3, n_{v2}=5, n_{i2}=6)$$

Step 2: perform corrections:

$$G_{Measured}^{1} = G_{Sheet}(f_{Measured}^{1A}, f_{Measured}^{1C})$$

$$G_{Measured}^{2} = G_{Sheet}(f_{Measured}^{2A}, f_{Measured}^{2C})$$

$$G_{Measured}^{3} = f_{Measured}^{3}$$

$$G_{Measured}^{4} = f_{Measured}^{4}$$

$$G_{Measured}^{5} = f_{Measured}^{5}$$

Where $G_{Sheet}$ represents the method described previously.

Step 3: Guess the initial parameters $$R_T = R_{T,0}, R_B = R_{B,0}, RA = RA_0$$

Step 4: Calculate Model Data Using:

$$f_{Model}^{1A}(z^{1A}=d_{13}, y^{1A}=d_{24}, z^{1A}=d_{12}, w^{1A}=d_{34})$$

$$f_{Model}^{1C}(x^{1C}=d_{13}, y^{1C}=d_{24}, z^{1C}=d_{23}, w^{1C}=d_{14})$$

$$f_{Model}^{2A}(x^{2A}=d_{24}, y^{2A}=d_{35}, z^{2A}=d_{23}, w^{2A}=d_{45})$$

$$f_{Model}^{2C}(x^{2C}=d_{24}, y^{2C}=d_{35}, z^{2C}=d_{34}, w^{2C}=d_{25})$$

$$f_{Model}^{3}(x^{3}=d_{35}, y^{3}=d_{46}, z^{3}=d_{34}, w^{3}=d_{56})$$

$$f_{Model}^{4}(x^{4}=d_{14}, y^{4}=d_{35}, z^{4}=d_{13}, w^{4}=d_{45})$$

$$f_{Model}^{5}(x^{5}=d_{15}, y^{5}=d_{36}, z^{5}=d_{13}, w^{5}=d_{56})$$

Step 5: Perform pseudo correction on calculated data:

$$G_{Model}^{1} = G_{Sheet}(f_{Model}^{1A}, f_{Model}^{1C})$$

$$G_{Model}^{2} = G_{Sheet}(f_{Model}^{2A}, f_{Model}^{2C})$$

$$G_{Model}^{3} = f_{Model}^{3}$$

$$G_{Model}^{4} = f_{Model}^{4}$$

$$G_{Model}^{5} = f_{Model}^{5}$$

Step 6: Calculate the objective function $$F_{Obj} = \sum_{i=1}^{5} (G_{Model}^{i} - G_{Measured}^{i})^2$$

Where the $l_2$ norm is used in the equation $$\min_{P} \| G\{f_{Model}(P)\} - G\{f_{Measured}\} \|.$$

Step 7: Adjust parameters and redo steps 4, 5 and 6 until $F_{Obj}$ have reached minimum.

Step 8: Extract resulting parameters $R_T$, $R_B$ and RA.

Figure 6:
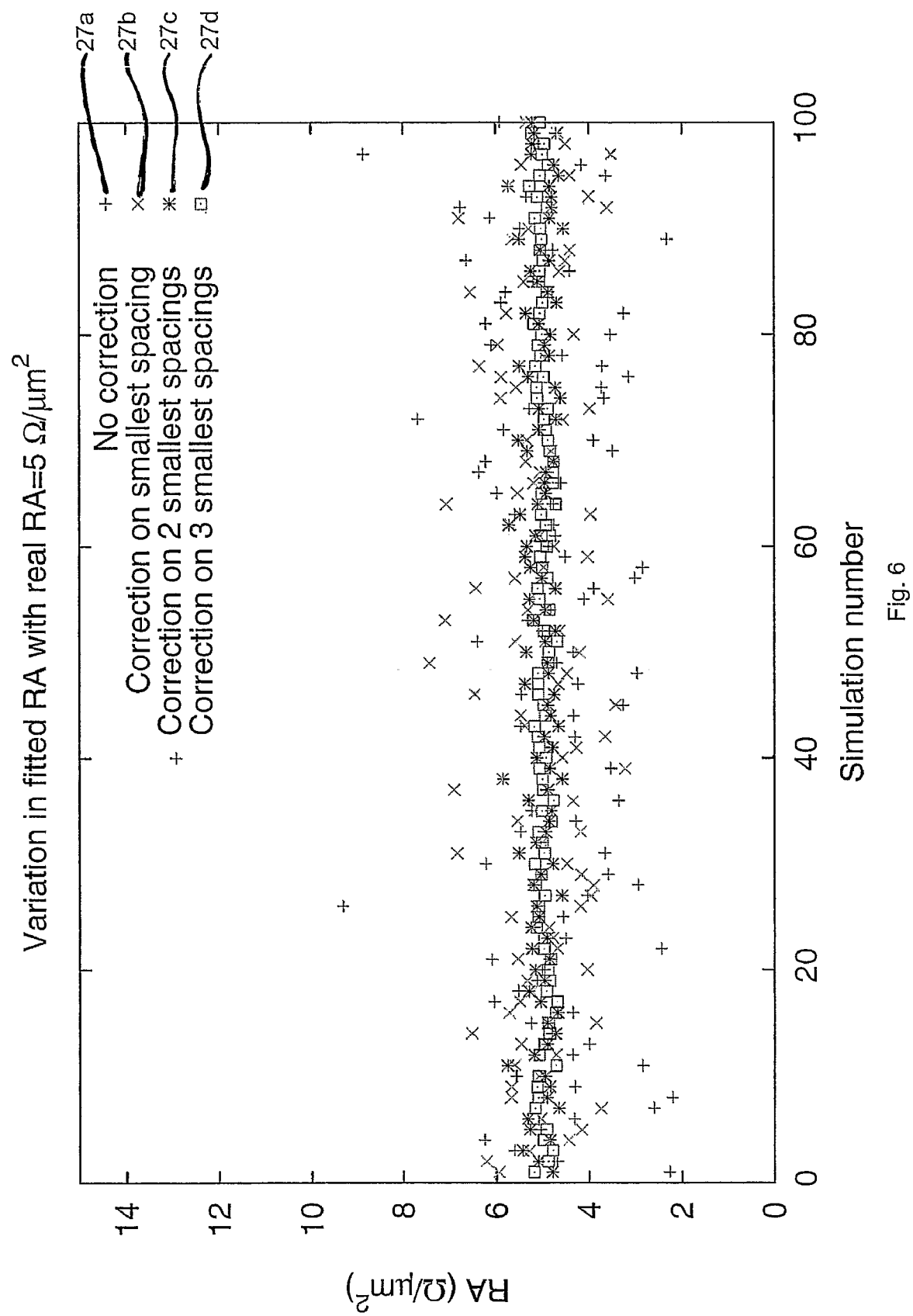
FIG. 6 is a further illustration of simulation results.

The method is illustrated in FIG. 6

Figure 7:
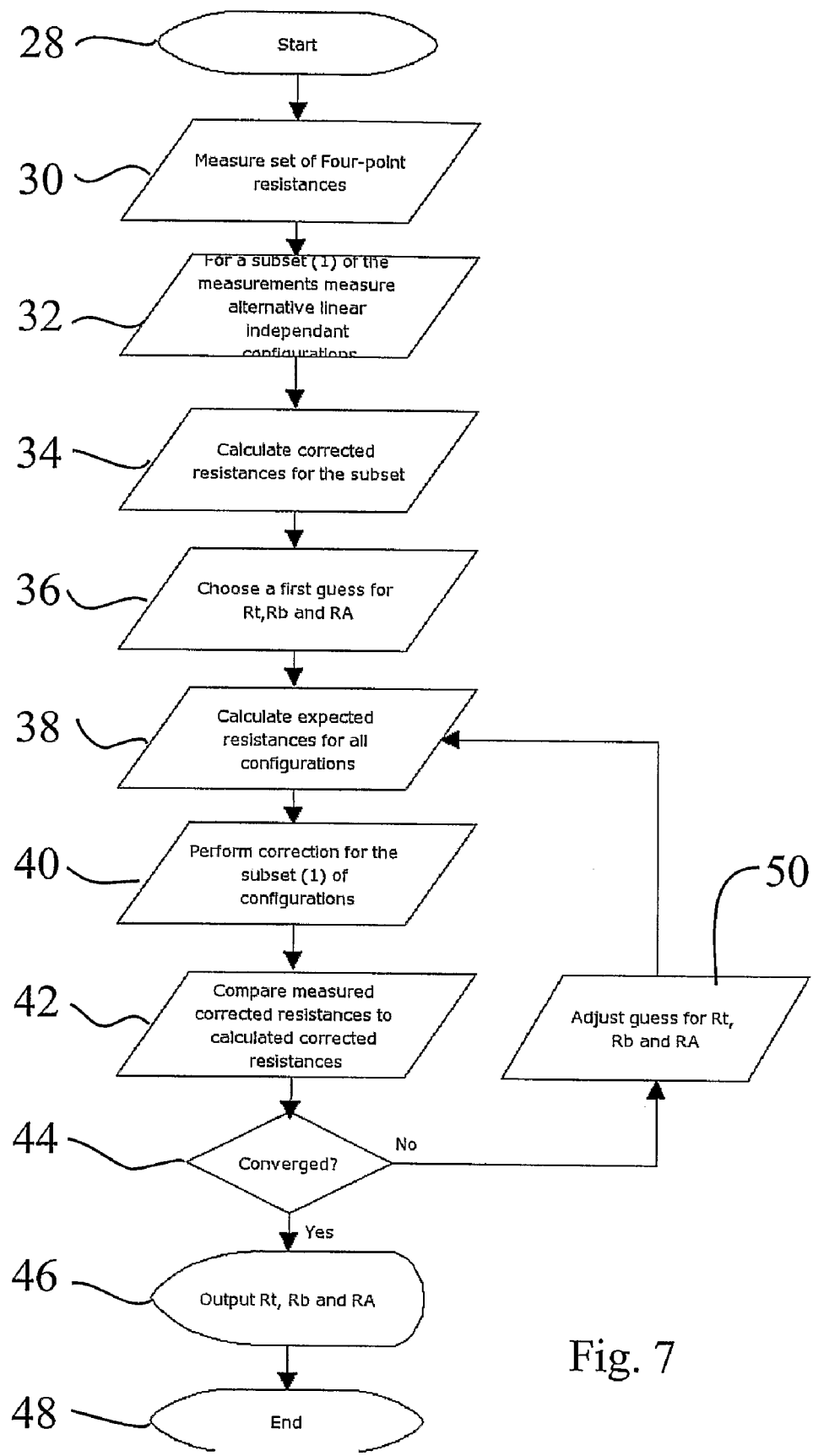
FIG. 7 is a block diagram representing a method according to the present invention.

FIG. 7 illustrates a simulation of the performance of the correction scheme $f_{Measured}$, as been simulated using the configuration of a real 12 point probe with smallest tip-spacing of 1 μm. For each simulation 8 sets or groups of tips have been used. The simulation uses $R_T=1\Omega$, $R_B=1\Omega$ and $R_A=5\ \Omega/\mu m^2$. Each tip position varies with a random square distribution of ±50 nm. The figure clearly shows that the variation in the extracted RA decreases with increasing level of correction at least until the set with the 3rd smallest spacing.

TABLE 1

| No. of corrections | 0 | 1 | 2 | 3 |
|---|---|---|---|---|
| Relative standard deviation $R_T$ (%) | 700 | 120 | 4.1 | 4.8 |
| Relative standard deviation $R_B$ (%) | 51.2 | 26.7 | 3.9 | 4.2 |
| Relative standard deviation RA (%) | 685 | 61.3 | 10.2 | 12.5 |
| Mean $R_T$ | $2.7 * 10^6$ | 2.02 | 1.00 | 1.00 |
| Mean $R_B$ | 1.05 | 0.98 | 1.00 | 1.00 |
| Mean RA | 900 | 1.32 | 1.01 | 1.01 |

$R_T = 1\ \Omega$,
$R_B = 1\ \Omega$,
$RA = 1\ \Omega/\mu m^2$

TABLE 2

| No. of corrections | 0 | 1 | 2 | 3 |
|---|---|---|---|---|
| Relative standard deviation $R_T$ (%) | $1.0 * 10^3$ | 29.4 | 2.0 | 1.8 |
| Relative standard deviation $R_B$ (%) | 29.2 | 9.8 | 1.8 | 1.1 |
| Relative standard deviation RA (%) | $1.0 * 10^3$ | 37.6 | 7.3 | 6.8 |
| Mean $R_T$ | $1.1 * 10^7$ | 1.06 | 1.00 | 1.00 |
| Mean $R_B$ | 0.96 | 0.99 | 1.00 | 1.00 |
| Mean RA | $2.4 * 10^5$ | 2.14 | 1.99 | 2.02 |

$R_T = 1\ \Omega$,
$R_B = 1\ \Omega$,
$RA = 2\ \Omega/\mu m^2$

TABLE 3

| No. of corrections | 0 | 1 | 2 | 3 |
|---|---|---|---|---|
| Relative standard deviation $R_T$ (%) | 9.9 | 2.4 | 0.8 | 0.5 |
| Relative standard deviation $R_B$ (%) | 7.9 | 1.5 | 0.9 | 0.9 |
| Relative standard deviation RA (%) | 27.2 | 18.7 | 5.1 | 2.7 |
| Mean $R_T$ | 1.02 | 1.00 | 1.00 | 1.00 |
| Mean $R_B$ | 1.00 | 1.00 | 1.00 | 1.00 |
| Mean RA | 5.14 | 5.20 | 5.05 | 4.98 |

$R_T = 1\ \Omega$,
$R_B = 1\ \Omega$,
$RA = 5\ \Omega/\mu m^2$

TABLE 4

| No. of corrections | 0 | 1 | 2 | 3 |
|---|---|---|---|---|
| Relative standard deviation $R_T$ (%) | 5.8 | 0.8 | 0.4 | 0.2 |
| Relative standard deviation $R_B$ (%) | 4.7 | 1.1 | 0.8 | 0.9 |
| Relative standard deviation RA (%) | 21.1 | 13.3 | 3.9 | 1.5 |

TABLE 4-continued

| No. of corrections | 0 | 1 | 2 | 3 |
|---|---|---|---|---|
| Mean $R_T$ | 0.99 | 1.00 | 1.00 | 1.00 |
| Mean $R_B$ | 1.01 | 1.00 | 1.00 | 1.00 |
| Mean RA | 10.6 | 10.3 | 10.0 | 10.0 |

$R_T = 1\,\Omega$,
$R_B = 1\,\Omega$,
$RA = 10\,\Omega/\mu m^2$

TABLE 5

| No. of corrections | 0 | 1 | 2 | 3 |
|---|---|---|---|---|
| Relative standard deviation $R_T$ (%) | 3.8 | 0.1 | 0.1 | 0.1 |
| Relative standard deviation $R_B$ (%) | 18.8 | 10.0 | 5.9 | 2.0 |
| Relative standard deviation RA (%) | 34.5 | 11.2 | 7.7 | 2.2 |
| Mean $R_T$ | 1.00 | 1.00 | 1.00 | 1.00 |
| Mean $R_B$ | 0.96 | 0.97 | 0.99 | 1.00 |
| Mean RA | 110 | 103 | 101 | 100 |

$R_T = 1\,\Omega$,
$R_B = 1\,\Omega$,
$RA = 100\,\Omega/\mu m^2$

Tables 1 to 5 summarise simulations using different values of RA. The results show that the correction method generally decreases the error on the extracted parameters and lower the value of RA where meaningful parameters can be extracted.

The magneto resistance of the CIPT-structure is not included in the demonstration of the method, since it does not change the basic concept. The method can be applied both with subsets of a multipoint probe and measurements using several multipoint probes. The correction can be applied on any number of the sets of tips.

The correction need not to be applied on the smallest spacing, but can be applied on any of the sets or groups of tips. The method can be applied on other geometries than the CIPT structure provided that the model is changed accordingly. Other correction schemes than the presented may be used. The crucial point is that correction is applied on both the measured and calculated values, to create comparable data. Calculation of corrected values may be an integrated part of performing the measurement. New measurements may be performed after an initial correction in order to refine the result. As described previously any of the linear independent configurations may be used in the correction. And the search parameter, i.e. model value, may be any of $\alpha$, $\beta$ or $\gamma$ as described earlier.

FIG. 6 schematically illustrates variations in fitted RA with real $RA=5\,\Omega/\mu m^2$. In the figure are shown results with no correction 27a, correction on smallest spacing 27b, correction on 2 smallest spacings 27c and correction on 3 smallest spacings 27d.

FIG. 7 schematically illustrates steps of an embodiment of the method according to the teachings of the present invention. The starting point is step 28. Sets of four-point measurement are performed in step 30. Prior to the measurement being performed a probe has been positioned in electrical contact with a surface of a test sample.

For a subset of the measurements, alternative linear independent configurations are measured in step 32. The measurements may be performed in different combinations, i.e. there are multiple possibilities where the current may be applied, and likewise for the choice of points where the corresponding voltage is to be measured.

Calculate corrected resistance for the subset in step 34. After performing the measurements in steps 30 and 32 correction values are then calculated.

Choose a first guess for $R_T$, $R_B$ and RA in step 36. The first guess for the electrical properties to be determined is established.

Calculate expected resistances for all configurations in step 38. Based on the first guess for $R_T$, $R_B$ and RA the expected, or theoretical, model value is calculated.

Perform correction for the subset of configurations in step 40. The model values are corrected in the same way as the measured values.

Compare measured corrected resistances to calculated corrected resistances 42. A comparison is made between the corrected, measured values and the corrected, model values.

In step 44 a check is performed to see if the corrected, measured values and the corrected, model values converge. If the corrected, measured values and the corrected, model values are sufficiently close, the method has yielded an acceptable answer.

Output $R_T$, $R_B$ and RA 46 and the method ends in step 48.

The values may e.g. be outputted to a recording device or a printer device.

If the corrected, measured values and the corrected, model values do not converge, the guess for $R_T$, $R_B$ and RA is adjusted in step 50. The adjusted values are then returned for a new calculation in steps 38-44. The process may be iterated until a sufficiently acceptable answer is obtained. The acceptance of the values $R_T$, $R_B$ and RA may be based on determining a minimum between the corrected, measured values and the corrected, model values.

The present invention may be characterised by the following points:

1. A method for calculating a correction factor for reduction of positional errors in resistance measurements using four-point probes, said four-point probe having a body and four probe arms each including a probe, said probe arms extending parallel from said body, said four-point probe including electrical contact points for establishing electrical contact between said probes and a test apparatus transmitting and receiving electrical signals, said method comprising the steps of:

positioning said probe arms in contact with a surface of said test sample, selecting a first set comprising a first and a second probe arm and a second set comprising a third and a fourth probe arm, applying a first current from said test apparatus through said first probe arm of said first set to said second probe arm of said first set, said first current propagating through said test sample, detecting a first induced voltage between said third and fourth probe arms of said second set, calculating a first four-point resistance, $R_{first}$, being a ratio of said first voltage and said first current, selecting a third set comprising a first and a second probe arm, wherein said third set includes no more than one of said probe arms of said first set, and a fourth set comprising a third and a fourth probe arm wherein said fourth set includes no more than one of said probe arms of said second set, applying a second current from said test apparatus through said first probe arm of said third set to said second probe arm of said third set, said second current propagating through said test sample, detecting a second induced voltage at said third and fourth probe arms of said fourth set, calculating a second four-point resistance, $R_{second}$, being a ratio of said second voltage and said second current, calculating a correction factor based on said first and second four-point resistance.

2. The method according to point 1, wherein said method further includes:

performing a measurement for calculating resistance of said test sample using said correction factor.

3. The method according to point 2, wherein said probe is repeatedly moved to a remote position, and said steps of points 1 and 2 are repeatedly performed for each position.

4. A method for performing resistance measurements using four-point probes using a correction factor for reduction or elimination of positional errors, said four-point probe having a body and four probe arms each including a probe, said probe arms extending parallel from said body, said four-point probe including electrical contact points for establishing electrical contact between said probes and a test apparatus transmitting and receiving electrical signals, said method comprising the steps of:

positioning said probe arms in contact with a surface of said test sample, selecting a first set comprising a first and a second probe arm and a second set comprising a third and a fourth probe arm, applying a first current from said test apparatus through said first probe arm of said first set to said second probe arm of said first set, said first current propagating through said test sample, detecting a first induced voltage at said third and fourth probe arms of said second set, calculating a first four-point resistance, $R_{first}$, being a ratio of said first voltage and said first current, selecting a third set comprising a first and a second probe arm, wherein said third set includes no more than one of said probe arms of said first set, and a fourth set comprising a third and a fourth probe arm wherein said fourth set includes no more than one of said probe arms of said second set, applying a second current from said test apparatus through said first probe arm of said third set to said second probe arm of said third set, said second current propagating through said test sample, detecting a second induced voltage between the third and fourth probe arms of said fourth set, calculating a second four-point resistance, $R_{second}$, being a ratio of said second voltage and said second current, calculating a correction factor based on said first and second four-point resistances calculating resistance of said test sample using said correction factor.

5. The method according to point 4, wherein said probe is repeatedly moved to a remote position, and said steps of point 4 are repeatedly performed for each position.

6. A test apparatus having a first and a second holder for holding a test sample and a test probe, respectively, a memory device for storing a computer implementation of the method according to point 1 and/or point 4 and a microprocessor for executing the computer implementation of the method according to point 1 and/or point 4.

The invention claimed is:

1. A method for calculating a correction factor for reduction of positional errors in resistance measurements using a four-point probe, said four-point probe having a body and four probe arms each including a probe, said probe arms extending parallel from said body, said four-point probe including electrical contact points for establishing electrical contact between said probes of said probe arms and a test apparatus operable for transmitting and receiving electrical signals, said method comprising said steps of:

(a) positioning said probe arms in contact with a surface of a test sample, (b) selecting a first set comprising a first and a second probe arm and a second set comprising a third and a fourth probe arm, (c) applying a first current from said test apparatus through said first probe arm of said first set to said second probe arm of said first set, said first current propagating through said test sample, (d) detecting a first induced voltage between said third and fourth probe arms of said second set, (e) calculating a first four-point resistance, $R_{first}$, being a ratio of said first voltage and said first current, (f) selecting a third set comprising a first and a second probe arm, wherein said third set includes no more than one of said probe arms of said first set, and a fourth set comprising a third and a fourth probe arm wherein said fourth set includes no more than one of said probe arms of said second set, (g) applying a second current from said test apparatus through said first probe arm of said third set to said second probe arm of said third set, said second current propagating through said test sample, (h) detecting a second induced voltage at said third and fourth probe arms of said fourth set, (i) calculating a second four-point resistance, $R_{second}$, being a ratio of said second voltage and said second current, and (j) calculating a correction factor based on said first and second four-point resistances.

2. The method according to claim 1, wherein said method further includes:

(k) performing a measurement for calculating a resistance of said test sample using said correction factor.

3. The method according to claim 1, wherein said four-point probe is moved to a remote position and said steps (a) through (j) are performed for the remote position.

4. A test apparatus, comprising:

a first holder configured holding a test sample;

a second holder configured for holding a test probe;

a memory device operable for storing a computer implementation of the method according to claim 1; and a microprocessor operable for executing said computer implementation.

5. A method for performing resistance measurements using four-point probes using a correction factor for reduction or elimination of positional errors, said four-point probe having a body and four probe arms each including a probe, said probe arms extending parallel from said body, said four-point probe including electrical contact points for establishing electrical contact between said probes of said probe arms and a test apparatus operable for transmitting and receiving electrical signals, said method comprising said steps of:

(a) positioning said probe arms in contact with a surface of a test sample, (b) selecting a first set comprising a first and a second probe arm and a second set comprising a third and a fourth probe arm,
(c) applying a first current from said test apparatus through said first probe arm of said first set to said second probe arm of said first set, said first current propagating through said test sample,
(d) detecting a first induced voltage at said third and fourth probe arms of said second set,
(e) calculating a first four-point resistance, $R_{first}$, being a ratio of said first voltage and said first current,
(f) selecting a third set comprising a first and a second probe arm, wherein said third set includes no more than one of said probe arms of said first set, and a fourth set comprising a third and a fourth probe arm wherein said fourth set includes no more than one of said probe arms of said second set,
(g) applying a second current from said test apparatus through said first probe arm of said third set to said second probe arm of said third set, said second current propagating through said test sample,
(h) detecting a second induced voltage between said third and fourth probe arms of said fourth set,
(i) calculating a second four-point resistance, $R_{second}$, being a ratio of said second voltage and said second current,
(j) calculating a correction factor based on said first and second four-point resistances, and
(k) calculating a resistance of said test sample using said correction factor.

6. The method according to claim 5, wherein said four-point probe is moved to a remote position and said steps (a) through (k) are performed for the remote position.

7. A test apparatus, comprising:
a first holder configured for holding a test sample;
a second holder configured for holding a test probe;
a memory device operable for storing a computer implementation of the method according to claim 5; and
a microprocessor operable for executing said computer implementation.

* * * * *